United States Patent [19]

Thrift et al.

[11] Patent Number: 4,885,549
[45] Date of Patent: Dec. 5, 1989

[54] METHOD OF PHASE AND AMPLITUDE CORRECTION OF NMR SIGNALS USING A REFERENCE MARKER

[75] Inventors: Robert L. Thrift, Livermore, Calif.; Paul K. Morris, Gloucester, Canada

[73] Assignee: General Electric Company, New York, N.Y.

[21] Appl. No.: 278,121

[22] Filed: Nov. 30, 1988

[51] Int. Cl.$^4$ .............................................. G01R 33/20
[52] U.S. Cl. ...................................... 324/307; 324/300
[58] Field of Search ............... 324/300, 307, 308, 309, 324/310, 317, 314

[56] References Cited

U.S. PATENT DOCUMENTS

| | | | |
|---|---|---|---|
| 3,999,118 | 12/1976 | Hoult | 324/314 |
| 4,703,267 | 10/1987 | Maudsley | 324/307 |
| 4,703,270 | 10/1987 | Hall et al. | 324/309 |
| 4,746,860 | 5/1988 | Satoh | 324/307 |

Primary Examiner—Michael J. Tokar
Attorney, Agent, or Firm—Quarles & Brady

[57] ABSTRACT

A marker substance is introduced into the sample volume undergoing NMR analysis. The frequency spectrum of the NMR signal is analyzed to isolate the marker substance frequency peaks. Comparison of marker substance frequency peak phase and amplitude between NMR experiments provides information from which a correction for phase and amplitude variations due to system instability can be made.

5 Claims, 3 Drawing Sheets

METHOD OF PHASE AND AMPLITUDE CORRECTION OF NMR SIGNALS USING A REFERENCE MARKER

BACKGROUND OF THE INVENTION

This invention relates to the fields of NMR spectroscopy and imaging and, more particularly, to a method for correcting for variations in the phase and amplitude between two NMR signals acquired in successive experiments or scans.

The source of variation in a signal acquired during successive NMR experiments is principally the result of changes in the strength of the applied polarizing magnetic field $B_o$. Changes in $B_o$ may result from physical changes in the NMR magnet, because of vibration or thermal stress, or may result from the influence of outside objects on the magnetic field.

Variations in the amplitude of the signal between successive NMR experiments occurs because of the additional step of averaging several signals acquired during each experiment into a composite signal for that experiment. Phase shifts between such multiple signals, acquired in a given experiment, translate to amplitude variations in the averaged signal.

The need for precisely reproducible spectroscopy signal phase and amplitude arises from a class of spectroscopy techniques which investigate small signals, such as those arising from proton coupling between certain elements, in the presence of larger unwanted signals, such as uncoupled proton resonances from water. Suppressing the larger, obscuring signals is performed by designing an experiment where successively acquired signals are identical but for a phase difference in the signal of interest. Subtracting these successive signals cancels the unwanted, obscuring signal which remains constant between the experiments. The signal of interest, whose phase was changed, is not cancelled. Frequently, the obscuring signal is several orders of magnitude greater than the signal of interest. Therefore it is essential that the phase and amplitude of the obscuring signals remain constant between successive experiments, otherwise, after the subtraction process a substantial component of the unwanted signal will remain uncancelled.

One such spectroscopy experiment, where phase and amplitude stability is critical, is described in co-pending U.S. patent application Ser. No. 07/181,996 which describes a number of techniques for cancelling unwanted NMR signals by adjusting the phase of only certain components of these signals between successive experiments.

In the area of NMR imaging, precise phase and amplitude stability may improve the signal-to-noise ratio of the resulting signal and the resolution of the image or spectra which is dependent, in one or more axis, on phase information. Imaging techniques such as "spin echo", because of their long acquisition delays, are particularly susceptible to phase error.

SUMMARY OF THE INVENTION

The present invention relates to a computational means for correcting errors of phase and amplitude in successively acquired NMR signals where such errors result from instability in the spectroscopy or imaging equipment, particularly from variations in the applied polarizing, magnetic field $B_o$.

More specifically, in one embodiment of the invention, a reference resonance peak in a Fourier transformed NMR signal is isolated and used in successive experiments as a reference to correct for variations in phase and amplitude. The isolated peak is inverse transformed to produce a band pass filtered, complex, time domain signal. The ratio of two such signals, from successive experiments, is employed to produce a complex correction factor. This correction factor, when applied to the NMR signal, corrects that signal's phase and amplitude not only for the reference peak but for other peaks in the signal's spectrum with comparable phase and amplitude error.

In an alternative embodiment, the resonant peak used as a reference is derived mathematically or acquired through a carefully controlled experiment and used to normalize the phase of successively acquired signals.

A general object of the invention is to improve the signal-to-noise ratio of signals acquired in imaging or spectroscopy applications. When the present invention is employed in a spectroscopy or imaging application where a number of signals are averaged together to improve signal-to-noise ratio, correction of phase error between such signals may increase the signal-to-noise gain achieved with each additional signal. This is because the phase error no longer prevents the signals from being perfectly additive.

Another object of the invention is to reduce amplitude variations between the signals acquired in successive NMR experiments resulting from the averaging of several signals for each experiment. Phase errors between such averaged signals translate to amplitude errors in the averaged signal. Reduction of phase error reduces this amplitude error.

Yet a further object of the invention is to reduce amplitude errors resulting from gain changes in the spectroscopy or imaging equipment signal acquisition chain. The relative amplitudes of successive reference peaks in acquired NMR signals are incorporated into the correction factor providing a correction for such phase independent amplitude fluctuations.

An additional object of the invention is to reduce geometric distortion in NMR imaging applications. The phase of an NMR signal defines the NMR image in one or more dimensions. Reduction of phase error improves the spatial accuracy of the NMR image.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
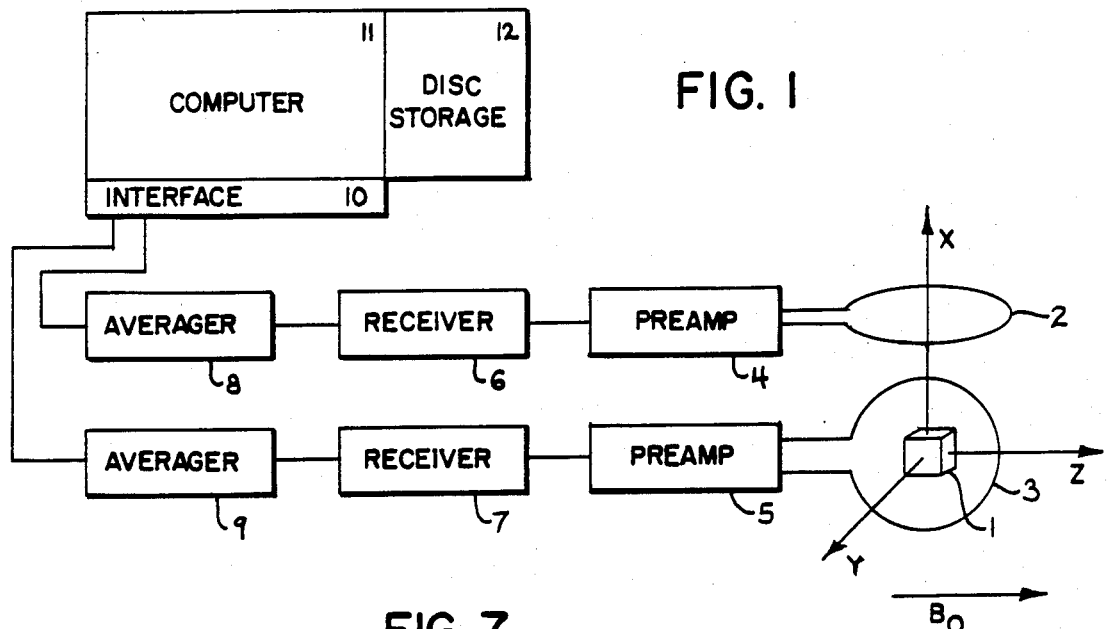
FIG. 1 is a simplified, schematic, representation of a Nuclear Magnetic Resonance experiment.

Referring initially to FIG. 1 there is shown a schematic representation of an NMR Spectroscopy system suitable for use with the invention. A sample 1 is held within a static, homogenous, polarizing magnetic field $B_o$ directed in the positive z axis direction of a Cartesian coordinate system. The origin of the coordinate system is considered to be the center of the sample 1. As is understood in the art, an external radio frequency field from a transmitter coil (not shown) is applied to the sample 1 to excite the nuclei or spins of the sample 1 into resonance at their Larmor frequencies. This external radio frequency field may consist of a single or multiple pulses. The external radio frequency field is then removed so that the NMR signal resulting from the decaying oscillations of the excited spins may be detected. For the purpose of improving signal-to-noise ratio, this NMR radio frequency signal is acquired by two orthogonally disposed loop antennas shown in FIG. 1 as antenna 2 and 3. Loop antenna 2 is positioned with its axis aligned with the x-axis of the above described coordinate system. Loop antenna 3 has its axis aligned with the y axis of the coordinate system. The NMR signal from antenna 2 and 3 respectively is amplified by preamplifiers 4 and 5. The resulting amplified signals are applied to receivers 6 and 7 respectively, for further amplification, detection and filtering. Receivers 6 and 7 also shift the frequency of the signals from the megahertz range to the kilohertz range, through conventional heterodyning processes, to facilitate sampling and digitizing the signals. The signals are then sampled and digitized by averagers 8 and 9 for processing by computer 11. The computer 11 performs data processing, such as Fourier transformations, data storage in conjunction with the disk storage unit 12 and other logical and arithmetic operations all of which are conventionally performed by minicomputers and hence described only functionally.

For the purpose of subsequent computational processing by computer 11, to be described in more detail below, the signal from one antenna is treated as an imaginary component and the signal from the other antenna is treated as a real component of a complex radio frequency signal. Hence for a given NMR experiment, two signals are acquired: a "real" signal, $A_r(t)$ and an "imaginary" signal, $A_i(t)$ which may be treated as a single complex function of time V(t).

$$V(t) = A_r(t) + jA_i(t) \tag{1}$$

For reasons that will become apparent below, it should be noted that in the case where V(t) may be approximated by a single frequency component i.e. a single rotating vector then:

$$V(t) = A \cos(\omega t) + jA \sin(\omega t) \tag{2}$$

where
$\omega = 2\pi/T$ and
T = the period of the single frequency component.

The cosine and sine terms in the above expression result from the 90 degree phase difference between signals acquired by orthogonal antennas. Term "A" represents the amplitude of that frequency component.

As mentioned, the signal V(t) is sampled and digitized by averagers 8 and 9 and hence may be considered an array of values $V(t_i)$, i=0 to n where the difference between index values $t_i$ and $t_{i+1}$ is the sampling period of the averagers 8 and 9 and is typically on the order of 50 microseconds for signals in the kilohertz range. The number of samples "n" may be on the order of 16 thousand for a typical NMR signal acquisition. For purposes of notational simplicity, these sampled arrays shall be designated as ordinary functions of time, e.g. V(t), it being understood that the functions are in fact manipulated as sampled and digitized arrays within computer 11.

Consider now two successive NMR experiments and the acquisition of two complex signals. For experiment 1 the signal will be termed A(t) including the real and imaginary parts of the signal as described above. For experiment two the signals will be termed B(t).

Figure 5:
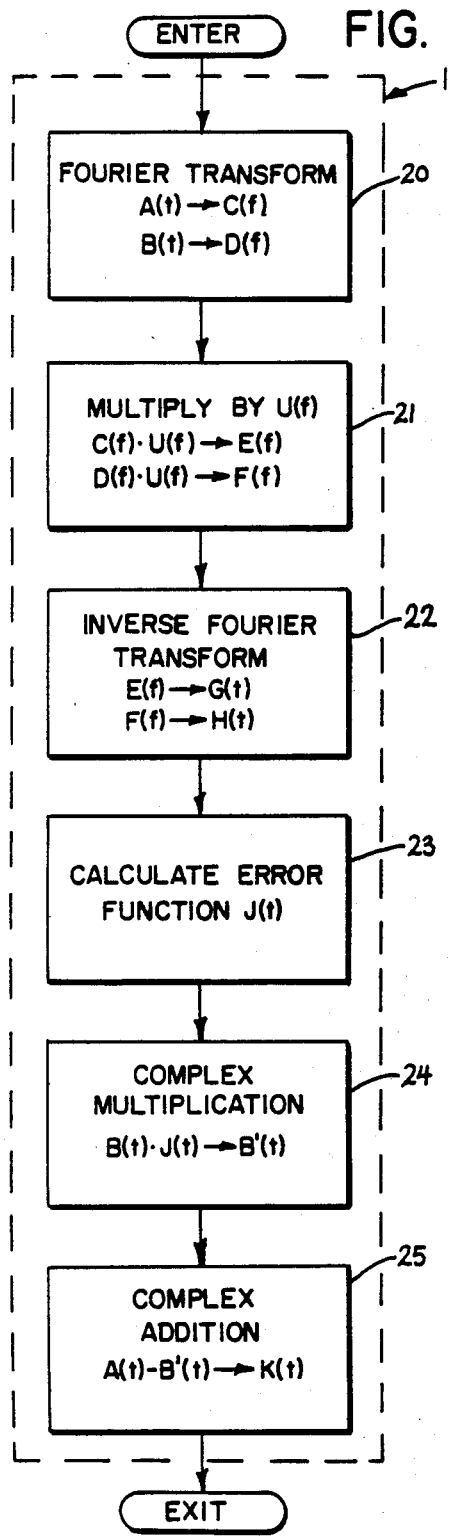
FIG. 5 is a block diagram showing the steps of the phase and amplitude correction process.

Referring now to FIG. 5 which shows a block diagram of the amplitude correction program 19 performed by computer 11, the first step of this program consists of taking the Fourier transform of each of the acquired signals as indicated by process block 20 and as represented in the following equations:

$$C(f) = F[A(t)] \tag{3}$$

$$D(f) = F[B(t)] \tag{4}$$

The Fourier transform may be performed by one of a number of fast Fourier transform algorithms known in the art. See for example: R. Bracewell, *The Fourier Transform and its Application*, McGraw-Hill, New York, (1965).

Generally, a Fourier transform produces a set of values indicating both the amplitude of the transformed signal's frequency components as a function of frequency and the phase of those frequency components as a function of frequency. Alternative implementations of the Fourier transform produce a set of real and imaginary values which together define the orientation and length of a vector for each frequency of the spectrum. These two results are mathematically equivalent and for the purposes of this discussion the latter implementation of the Fourier transform will be assumed.

Figure 2A:
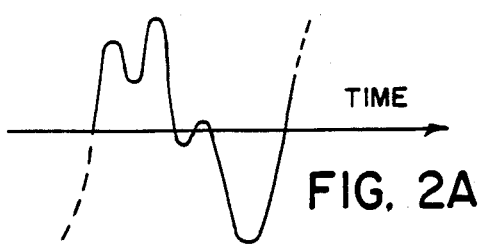
FIGS. 2E and 2H are graphic representation of the time domain NMR signal at various stages of the correction process.

FIG. 2(a) shows a typical real part of the NMR signal before the Fourier transform process. The horizontal axis in FIG. 2(a) is time. Waveform 2(a) is intended to represent an NMR signal which is produced by a multifrequency decay signal resulting from the precession of numerous atomic nuclei within the sample subsequent to their excitation by an external RF field as described above.

Figure 3B:
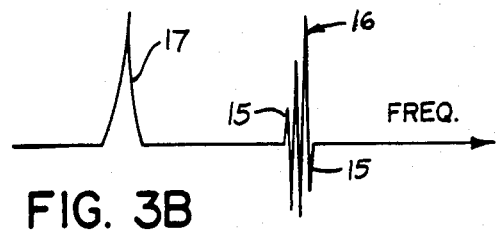
FIGS. 3B, 3C, 3D and 3I are graphic representation of the frequency domain NMR signal at various stages of the correction process.

Referring to FIG. 3(b), there is shown the real part of a typical complex frequency spectrum resulting from the Fourier transform of the signal of 2(a) and consisting of two peaks, 15 one positive going and one negative going, and one group of obscuring peaks 16. The horizontal axis is frequency as a result of the transformation. The peaks labeled 15 represent schematically the signals of interest for spectroscopy purposes, being near the resonant frequencies of the compounds being studied $f_1$. Peaks 16 are an obscuring signal which is ultimately to be cancelled by one of a number of phase shifting techniques, known in the art, which may be applied following the herein described phase correction process. Peaks 15 have been exaggerated for clarity; typically peaks 15 would be obscured by peak 16. Peak 17, is a reference peak or reference frequency component and may result naturally from compounds contained in the sample 1 or may be the result of an included volume of material in proximity to the sample being studied. Preferably this material, termed a "marker", has a sharp, well-defined peak in the frequency spectrum removed from the frequency of the signal of interest. A variety of materials are suitable for producing a reference peak, such as acetone or tetramethylsiline, and in the preferred embodiment of the invention water is employed for this purpose.

Referring again to FIG. 5, the next step of the correction program indicated at process block 21 consists of multiplying each of the transformed signals, on a point-by-point basis, by a windowing function $U(f)$ centered at $f_o$ and defined as follows:

$$U(f) = \begin{cases} 1 & (f_o - \Delta f) < f < (f_o + \Delta f) \\ 0 & (f_o - \Delta f) > f > (f_o + \Delta f) \end{cases} \quad (5)$$

Figure 3C:
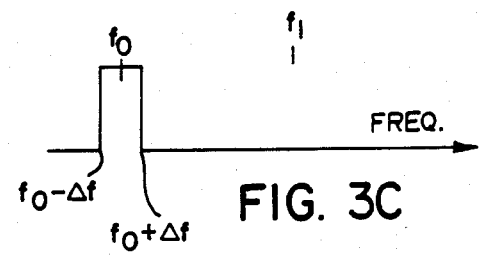

$\Delta f$ is chosen to be as large as possible to produce a symmetrical window about the reference peak 17 at $f_o$ without including any portions of the NMR signal of interest 15 or other peaks of different frequency within the spectrum frequency. It should be noted that fo and f1 refer to the resonant frequency of the compounds prior to any heterodyning. FIG. 3(c) shows the windowing function $U(f)$ and 3(d) shows a typical spectrum after application of the windowing function to the transformed NMR signal as expressed in the following equations:

$$E(f) = C(f) \cdot U(f) \quad (6)$$

$$F(f) = D(f) \cdot U(f) \quad (7)$$

The effect of this process is to isolate the reference peak by windowing a portion of the complex frequency spectrum near the reference peak at $f_o$. This is done by setting the value of the spectrum to zero at all points outside of this window centered at $f_o$. The windowing function given by equation (5) above has the advantage of simplicity but may produce truncation artifacts as a result of the discontinuities of $U(f)$ at $(f_o - \Delta f)$ and $(f_o + \Delta f)$. Other windowing functions may be selected to avoid such truncation errors, such as window functions based on a sine or gaussian curve. The window need not be constant within any frequency interval as long as it is the same for spectra $E(f)$ and $F(f)$.

Referring again to FIG. 5, the next step in the method as indicated at process block 22 is to take the inverse Fourier transform of the windowed spectra. The resulting signals are expressed by the following equations:

$$G(t) = F^{-1}[E(f)] \quad (8)$$

$$H(t) = F^{-1}[F(f)] \quad (9)$$

Figure 2E:
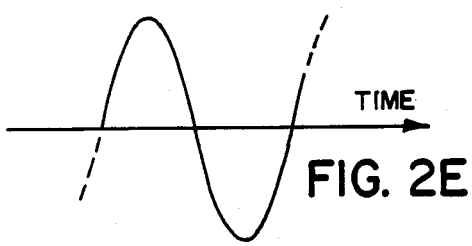
Figure 3D:

A typical signal resulting from this step is given in FIG. 2(e). The signal in FIG. 2(e) is equivalent to that produced by a band-pass filter operating on signals A(t) or B(t). As the window $\Delta f$ becomes decreasingly small, signals G(t) and H(t) may be considered to have only a single frequency component and may be represented, per equation 2, as follows:

$$G(t) = A_1 \cos(\omega t) + A_{1j} \sin(\omega t) \quad (10)$$

$$H(t) = A_2 \cos(\omega t + \phi) + A_{2j} \sin(\omega + \phi) \quad (11)$$

where $\phi$ is the phase difference or error between the signals G(t) and H(t).

By Euler's equation, these waveforms may be expressed in the alternate form:

$$G(t) = A_1 j^{\omega t} \quad (12)$$

$$H(t) = A_2 j^{(\omega t + \phi)} \quad (13)$$

Figure 6:
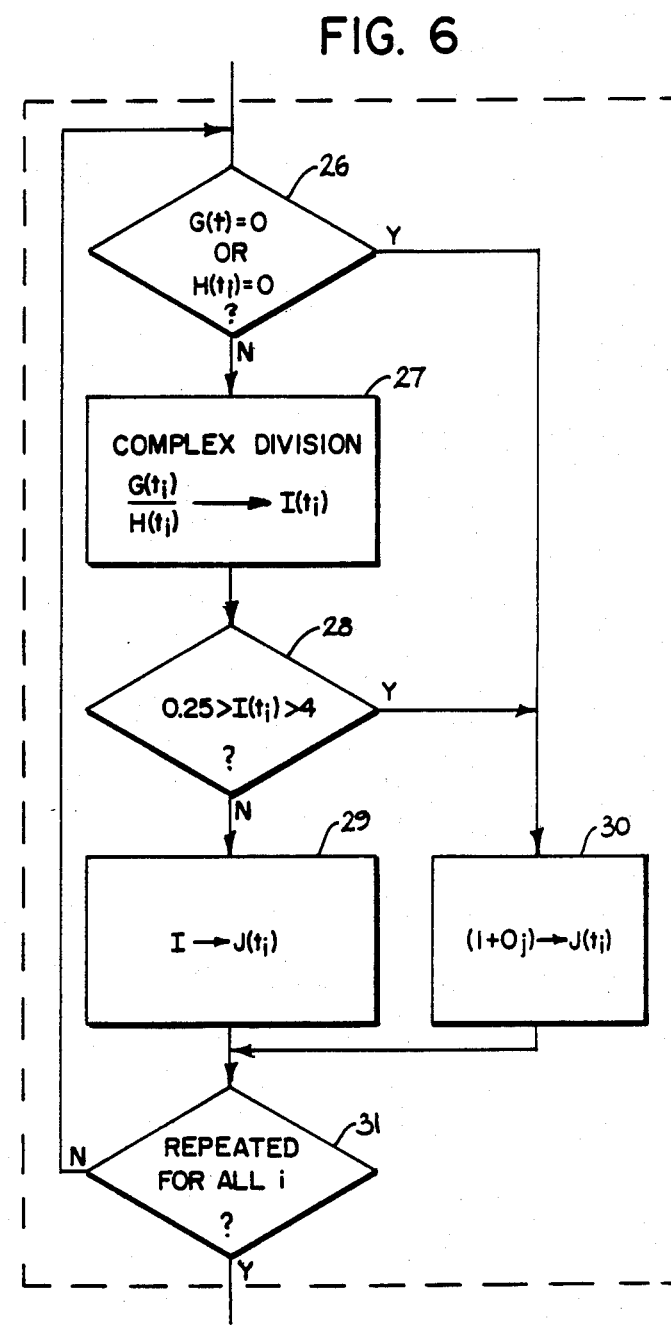
FIG. 6 is an expanded portion of the block diagram showing the correction factor calculation.

Referring again to FIG. 5, the next step in the method as indicated at process block 23 is to determine a correction factor J(t) as is shown in detail in FIG. 6. As shown in process block 26, G(t) and H(t) are first tested to see if they are equal to zero. If both are non-zero, an intermediate amplitude and phase correction factor I(t) is derived through a point-by-point complex division as shown in process block 27 and in the following equations:

$$I(t) = G(t)/H(t) \quad (14)$$

$$I(t) = M(t) e^{j\phi(t)} \quad (15)$$

where M(t) is the magnitude and $\phi(t)$ is the angle of the vector representation of this complex function.

Figure 4F:
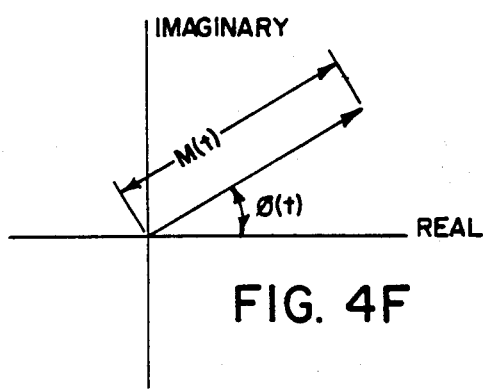
FIG. 4F and 4G are graphic representation of the correction factors in the complex plane.

The function I(t) may be envisioned as a vector whose angle and phase represent the phase and amplitude error between G(t) and H(t) at each sample point in time. A representation of the error function is shown in FIG. 4(f) in vector form.

This phase correction which is applicable to the reference peak 17 in FIG. 3b will also be applicable to peaks 15, 16 in FIG. 3(b) when the difference in frequency between the peaks 17, 16 and 15 (i.e. fo and f1) as shown in FIG. 3(b) is small in proportion to the average frequency (f1−fo)/2

$$\text{or:} \frac{1 - f_o}{(f_1 + f_o)/2} \cdot << 1 \quad (16)$$

In a typical MR experiment this quantity is on the order of a few parts per million and this condition is met. Thus, the phase and amplitude corrections $\phi(t)$ and M(t) will also accurately correct the NMR signals of interest.

The limits of resolution of the spectroscopy equipment, the process of digitization and the existence of noise on the original signals may cause occasional discontinuities in the error function I(t) as calculated above. These discontinuities may be detected by testing for one of the following two cases: (i) the denominator H(t) or numerator G(t) of the correction factor having a value of zero; or (ii) the magnitude of the error function $|I(t)|$ being greater than a first limit or less than a second limit. In the preferred embodiment, the first limit is 0.25 and the second limit is 4.

Figure 4G:
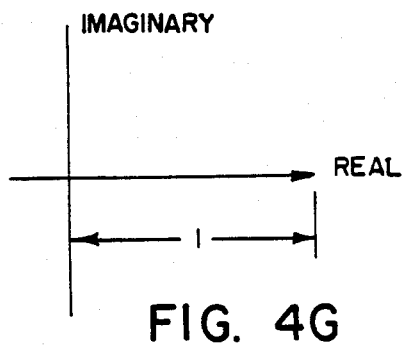

This first condition has previously been tested for in process block 20, the second condition is tested for in process block 28. If either of these conditions is true, the error function I(t) for that time argument t is set equal to (1+0j), i.e., (a unit vector along the real axis), in process block 30. FIG. 4(g) shows the vector representation of this substituted correction factor. The correction factor after this test and correction (if necessary) is referred to hereinafter as J(t).

The effect of replacing the error function at a given time argument with this value (1+0j) is that when the modified error function, J(t), is multiplied by a signal to be corrected, no change is made in the signal's amplitude or phase.

In summary, if neither the numerator G(t) or denominator H(t) of the error function is equal to zero, then a complex division of G(t) by H(t) is performed as indicated at process block 27 to yield a value I(t). This value I(t) is tested at decision block 29 to determine if its magnitude is between 0.25 and 4. If I(t) is not between these values, J(t) is again set equal to (1+0j). If I(t) is between 0.25 and 4, then J(t) is set equal to I(t) as indicated at process block 29. This correction process is repeated for each index value of t until the entire array is processed as determined at decision block 31.

Referring again to FIG. 5, the modified error function J(t) is applied to the original NMR signal B(t) by means of a point-by-point complex multiplication as indicated by process block 24 and the following expression:

$$B'(t) = B(t) \cdot J(t) \qquad (17)$$

The effect of multiplying B(t) by J(t) is to change the amplitude of B(t) at each sample point by M(t) and the phase of B(t) by $\phi(t)$.

Figure 2H:
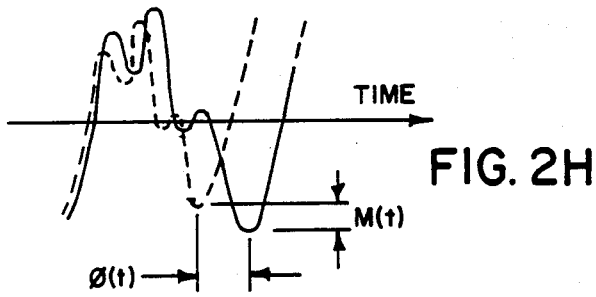

FIG. 2(h) shows signal B'(t) after correction (solid line) and B(t) before correction (dotted line). Note that the phase $\phi$ and amplitude M of B'(t) have been adjusted.

The above described process is performed on the signals from two successive NMR experiments or scans. Nevertheless, it should be apparent that this process could be performed pairwise on any number of successive signals in order to correct the amplitude and phase of these signals with respect to one another. Also, the signal to which the comparison is made need not be acquired for data acquisition purposes but may be simply a template signal of the desired characteristic. This template signal may be produced by careful experimentation under controlled conditions, or in simple cases it may be derived mathematically.

Figure 7:
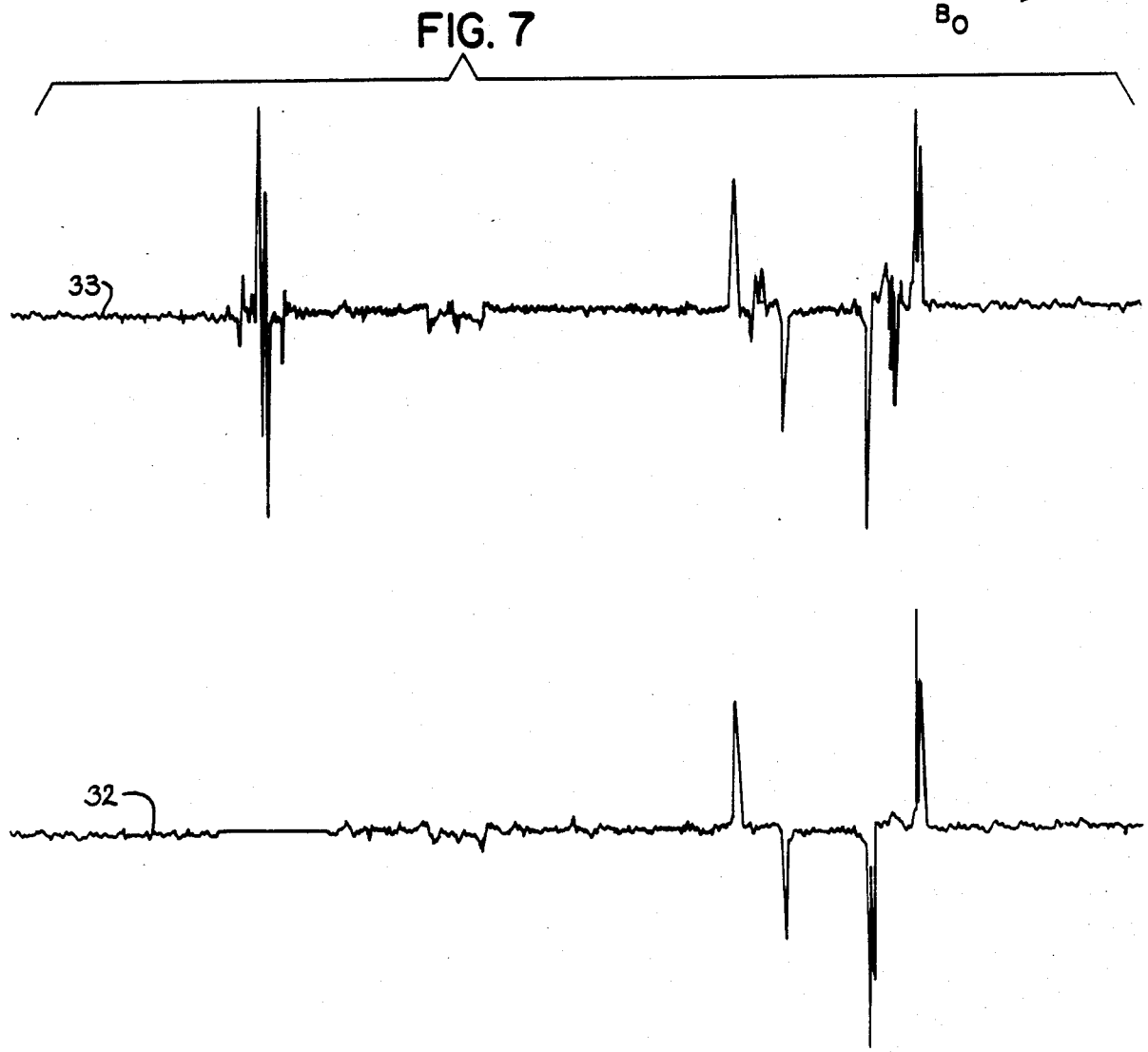
Figure 3I:
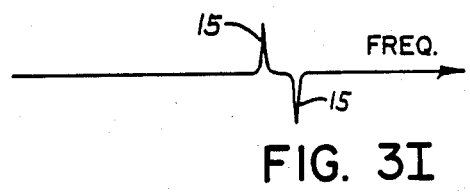

Referring again to FIG. 5, while not part of the correction method, process block 25 illustrates a typical use of the signal A(t) and the corrected signal B'(t). More specifically, signal B'(t) is subtracted from signal A(t) so as to cancel those portions of each signal that are in phase and to leave intact those portions of each signal which are out of phase. A representative Fourier transformation of the signal resulting from this subtraction is shown in FIG. 3(i). As may be seen peaks 15 are more pronounced. The above cancellation, of course, requires an experiment that will produce the appropriate phase shifts between signals A(t) and B(t), the description of which is outside the scope of this invention. Referring to FIG. 7, there are shown two spectra, each the combination of two signals as would be performed in process block 25. Spectra 31 shows the combination of signals without the application of the phase and amplitude correction techniques described herein. Spectra 32 shows the same combination of signals but with the application of the herein described phase and amplitude correction factors.

We claim:

1. A method of correcting phase and amplitude error between first and second complex NMR signals A(t) and B(t) comprising the steps of:
   identifying a first reference frequency component present in both NMR signals;
   band pass filtering the first and second complex NMR signals where the center frequency of the band pass filter is substantially the same as that of the reference frequency component, to produce corresponding first and second complex filtered signals G(t) and H(t);
   calculating a correction function J(t) by dividing the first complex filtered signal G(t) by the second complex filtered signal H(t);
   applying the complex correction function J(t) to the second complex NMR signal B(t) to produce a corrected second complex NMR signal B'(t) in which the phase and amplitude are adjusted.

2. A phase and amplitude correction method as described in claim 1 wherein the band pass filtering is performed by the steps of:
   Fourier transforming the first and second complex NMR signals A(t) and B(t) to produce a first and second complex frequency spectrum C(f) and D(f);
   setting the first and second complex frequency spectrum C(f) and D(f) equal to zero at all frequencies other than those of the reference frequency to produce a corresponding first and second modified frequency spectrum E(f) and F(f);
   performing an inverse Fourier transform on the first and second modified frequency spectra E(f) and F(f) to produce said corresponding first and second complex filtered signals G(t) and H(t).

3. The method as described in claim 1 wherein the calculation of the complex correction function J(t) is performed by the steps of:
   dividing the first complex filtered signal G(t) by a second complex filtered signal H(t) to produce an intermediate correction function I(t);
   setting the complex correction function J(t) to a predetermined default value when the intermediate correction function I(t) exceeds a first limit or is less than a second limit; and
   setting the complex correction function J(t) equal to the intermediate correction function I(t) when the magnitude of the intermediate correction function I(t) is between the first limit and the second limit.

4. A method of correcting phase and amplitude error between a first and second complex NMR signal A(t) and B(t) comprising the steps of:
   Fourier transforming complex signals A(t) and B(t) to produce frequency spectrum C(f) and D(f);
   identifying a reference peak in each spectra C(f) and D(f) at frequency $f_o$;
   multiplying frequency spectra C(f) and D(f) by windowing function U(f) centered at $f_o$ to produce spectra E(f) and F(f);
   inverse Fourier transforming spectra E(f) and F(f) to produce signals G(t) and H(t);
   dividing signals G(t) by H(t) to produce a correction function I(t);
   multiplying second complex NMR signal B(t) by correction function I(t) to produce a corrected complex NMR signal B'(t).

5. A method of correcting phase and amplitude error between a first and second complex NMR signal A(t) and B(t) comprising the steps of:
   Fourier transforming complex NMR signals A(t) and B(t) to produce frequency spectra C(f) and D(f);
   identifying a reference peak in each frequency spectra C(f) and D(f) at frequency $f_o$;

multiplying frequency spectra C(f) and D(f) by a windowing function U(f) centered at $f_o$ to produce spectra E(f) and F(f);

inverse Fourier transforming signals E(f) and F(f) to produce signals G(t) and H(t);

dividing signal G(t) by signal H(t) to produce a correction function I(t);

substituting a predetermined default value for the value of I(t) for those arguments t where I(t) is greater than a first limit or less than a second limit, to produce a modified correction function J(t);

multiplying complex NMR signal B(t) by modified correction function J(t) to produce a complex NMR signal B'(t) which is corrected in phase and amplitude.

* * * * *